United States Patent
Ramberg et al.

(10) Patent No.: US 9,984,274 B2
(45) Date of Patent: *May 29, 2018

(54) FINGERPRINT SENSING DEVICE AND METHOD THEREIN FOR NOISE DETECTION

(71) Applicant: Fingerprint Cards AB, Göteborg (SE)

(72) Inventors: Fredrik Ramberg, Göteborg (SE); Hans Thörnblom, Kungsbacka (SE)

(73) Assignee: Fingerprint Cards AB, Göteborg (SE)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/591,578

(22) Filed: May 10, 2017

(65) Prior Publication Data

US 2017/0330013 A1 Nov. 16, 2017

(30) Foreign Application Priority Data

May 13, 2016 (SE) .................... 16506446

(51) Int. Cl.
*G06K 9/00* (2006.01)
*G03F 7/16* (2006.01)
(Continued)

(52) U.S. Cl.
CPC .............. *G06K 9/0002* (2013.01); *G03F 7/16* (2013.01); *G06F 3/043* (2013.01); *G06F 3/044* (2013.01);
(Continued)

(58) Field of Classification Search
CPC ............ G06K 9/0002; G06K 9/00087; G06K 9/00899; G06K 9/00053; G06F 3/044; G06F 3/043; G06F 3/0436; G06F 7/16
See application file for complete search history.

(56) References Cited

U.S. PATENT DOCUMENTS 9,600,707 B1 3/2017 Ramberg et al.
2007/0031011 A1 2/2007 Erhart et al.
(Continued)

FOREIGN PATENT DOCUMENTS

EP 2184700 A2 5/2010
WO 9926187 A1 5/1999

OTHER PUBLICATIONS

Swedish Search Report for Application No. 1650644-6 dated Jan. 17, 2017, 3 pages.
(Continued)

*Primary Examiner* — Chan Park
*Assistant Examiner* — Timothy Choi
(74) *Attorney, Agent, or Firm* — RMCK Law Group PLC

(57) ABSTRACT

A capacitive fingerprint sensing device and method therein for noise detection are disclosed. The capacitive fingerprint sensing device comprises a plurality of sensing elements, each comprising a sensing structure and configured to sense a capacitive coupling between the sensing structure and a finger. The fingerprint sensing device further comprises sensing circuitry and timing circuitry configured to control a timing of a drive signal. The fingerprint sensing device is controllable to operate in a noise-detection mode and in a fingerprint mode. In the noise-detection mode, the fingerprint sensing device is configured to control the timing circuitry such that no drive signal is provided. The fingerprint sensing device senses a capacitive coupling between the finger and at least one sensing structure and provides a sensing signal indicative of the capacitive coupling between the finger and the sensing structures by means of said sensing circuitry.

21 Claims, 4 Drawing Sheets

(51) Int. Cl.
G06F 3/044 (2006.01)
G06F 3/043 (2006.01)

(52) U.S. Cl.
CPC ........ *G06F 3/0436* (2013.01); *G06K 9/00053* (2013.01); *G06K 9/00087* (2013.01); *G06K 9/00899* (2013.01)

(56) References Cited

U.S. PATENT DOCUMENTS

| | | |
|---|---|---|
| 2014/0333328 A1 | 11/2014 | Nelson et al. |
| 2015/0015537 A1 | 1/2015 | Riedijk et al. |
| 2015/0022670 A1 | 1/2015 | Gozzini et al. |
| 2015/0169932 A1 | 6/2015 | Riedijk et al. |
| 2015/0347807 A1 | 12/2015 | Weber et al. |
| 2015/0363585 A1* | 12/2015 | Gooding ................ G06F 21/32 726/19 |
| 2016/0110581 A1 | 4/2016 | Heo et al. |
| 2016/0148034 A1* | 5/2016 | Kremin ................ G06K 9/0002 382/124 |
| 2016/0253539 A1 | 9/2016 | Shen et al. |
| 2017/0330013 A1 | 11/2017 | Ramberg et al. |
| 2017/0330014 A1* | 11/2017 | Ramberg ............ G06K 9/0002 |
| 2017/0330016 A1 | 11/2017 | Benkley |
| 2017/0336894 A1 | 11/2017 | Nelson |

OTHER PUBLICATIONS

International Search Report and Written Opinion for International Application No. PCT/SE2017/050484 dated Aug. 7, 2017, 10 pages.

\* cited by examiner

FINGERPRINT SENSING DEVICE AND METHOD THEREIN FOR NOISE DETECTION

CROSS-REFERENCE TO RELATED APPLICATIONS

This application claims priority to Sweden Application No. 1650644-6, filed on May 13, 2016, the disclosure of which is incorporated herein by reference in its entirety.

TECHNICAL FIELD

Embodiments herein relate to a capacitive fingerprint sensing device for capturing an image of a fingerprint. In particular, they relate to detecting noise in the capacitive fingerprint sensing device and a method for evaluating and selecting sensor settings in the capacitive fingerprint sensing device.

BACKGROUND

Various types of biometric systems are used more and more in order to provide for increased security and/or enhanced user convenience.

In particular, fingerprint sensing systems have been adopted in, for example, consumer electronic system and devices, thanks to their small form factor, high performance, and user acceptance.

Among the various available fingerprint sensing principles, such as capacitive, optical, thermal etc., capacitive sensing is most commonly used, in particular in applications where size and power consumption are important issues.

All capacitive fingerprint sensors provide a measure indicative of the capacitance between each of several sensing structures and a finger placed on or moved across the surface of the fingerprint sensor. If a fingerprint is going to be measured a drive signal is required in the capacitive fingerprint sensor to excite a change in potential difference between the finger and the sensing structure.

As capacitive fingerprint sensing devices are required to detect ever smaller capacitive differences in order to accurately capture a fingerprint image, the influence of noise in the sensor is becoming increasingly important. In particular, the fingerprint sensing device is particularly sensitive to externally injected common mode noise. Typically, this type of noise can be injected to the fingerprint sensor through a charger connected to a device in which the fingerprint sensor is located. Moreover, common mode noise can have a large spread in frequency, amplitude and shape. The injected common mode noise signal can make the system ground to swing in reference to the finger thereby looking like an additional drive signal. This results in corrupt measurements and poor image quality.

The negative impact of common mode noise can be suppressed or filtered by implementing various noise reduction techniques. One example of a technique for common mode noise suppression is to take the average of a number of digital readings from each pixel to reduce the influence of noise. However, analog to digital conversion is time consuming and it is not desirable to increase the time it takes to capture a fingerprint image. Alternatively, or in combination, it is possible to use post-processing methods which runs through the captured fingerprint image and tries to subtract characteristic common mode noise. However, a disadvantage of this method is that measurement values might be corrupted in case of saturation during the analog sampling, in which case it may be difficult or impossible to cancel the influence of noise.

Accordingly, there is a need for an improved method and capacitive fingerprint sensing device for efficiently detecting and handling noise.

SUMMARY

Therefore embodiments herein are to provide a fingerprint sensing device and method therein to effectively detect noise.

According to a first aspect of embodiments herein, the object is achieved by a fingerprint sensing device for sensing a fingerprint pattern of a finger. The capacitive fingerprint sensing device comprises a plurality of sensing elements, each sensing element comprises a sensing structure and is configured to sense a capacitive coupling between the sensing structure and a finger placed on a sensing surface of the sensing device. The capacitive fingerprint sensing device further comprises sensing circuitry configured to provide a sensing signal indicative of the capacitive coupling between the finger and the sensing structures. The capacitive fingerprint sensing device comprises timing circuitry configured to control a timing of a drive signal, the drive signal being configured to provide a change in potential difference between the finger and the sensing structure. The fingerprint sensing device is controllable to operate in a noise-detection mode and in a fingerprint mode. When the fingerprint sensing device operates in the noise-detection mode, the fingerprint sensing device is configured to control the timing circuitry such that no drive signal is provided. The fingerprint sensing device is configured to repeatedly sense a capacitive coupling between the finger and at least one sensing structure for a predetermined time period by means of the sensing circuitry and to provide a noise signal characterizing common mode noise in the fingerprint sensing device. When the fingerprint sensing device operates in the fingerprint mode, the sensing device is configured to control the timing circuitry such that a drive signal is provided, and to sense a capacitive coupling between the finger and a plurality of sensing structures and to provide sensing signals by means of said sensing circuitry to acquire a fingerprint image.

According to a second aspect of embodiments herein, the object is achieved by a method for detect noise in a fingerprint sensing device. The capacitive fingerprint sensing device comprises a plurality of sensing elements, each sensing element comprises a sensing structure and is configured to sense a capacitive coupling between the sensing structure and a finger placed on a sensing surface of the sensing device. The capacitive fingerprint sensing device further comprises sensing circuitry configured to provide a sensing signal indicative of the capacitive coupling between the finger and the sensing structures. The capacitive fingerprint sensing device comprises timing circuitry configured to control a timing of a drive signal, the drive signal being configured to provide a change in potential difference between the finger and the sensing structure. The fingerprint sensing device is controllable to operate in a noise-detection mode and in a fingerprint mode.

The fingerprint sensing device is controlled to operate in the noise-detection mode. When the fingerprint sensing device operates in the noise-detection mode, the fingerprint sensing device is configured to control the timing circuitry such that no drive signal is provided. The fingerprint sensing device repeatedly senses a capacitive coupling between the finger and at least one sensing structure and provides a time-dependent noise-signal indicative of the capacitive coupling between the finger and the sensing structures by means of said sensing circuitry. The noise signal is representative of common mode noise properties of the sensing device. The predetermined period of time for which the capacitive coupling is sensed is preferably longer than a full period of the noise to be characterized. Even more preferable, the time dependent noise signal comprises several periods of the common mode noise. The predetermined period of time may for example be in the range of 10 ms to 100 ms, such as 50 ms, using a sampling frequency in the range of 100 kHz to 1 MHz, such as 500 MHz.

Since the drive signal is disabled when the fingerprint sensing device senses the capacitive coupling between the finger and at least one sensing structure, only noise is captured. Therefore an existence of noise, e.g. common mode noise or other externally injected noise may be detected. The described system and method thus enables characterization of common mode noise in order to adjust the image capture process to avoid noise. The image capture process can be controlled by controlling the timing of sampling during image capture.

The noise detection method according to the embodiments herein may be used to evaluate or analyze all possible sensor settings or a set of predefined settings. Since the drive signal is disabled when the fingerprint sensing device captures an image, only noise is captured. By comparing the evaluated or analyzed results, the best set of sensor settings resulting in the lowest noise may be selected. In this way, a robust hardware based technique that can effectively setup the sensor settings to reduce or suppress noise already during the image sampling may be achieved. Therefore, the dynamic range of the fingerprint sensing device can be improved and saturation can be avoided. Furthermore, since the fingerprint sensing device has already setup the sensor setting with reduced noise at start up, during normal image capturing procedure, image corruption may be avoided and higher gain can be used, so post-processing may be performed effectively and image quality may be improved even more for captured fingerprint image.

BRIEF DESCRIPTION OF THE DRAWINGS

Examples of embodiments herein are described in more detail with reference to attached drawings in which.

DETAILED DESCRIPTION

Figure 1:
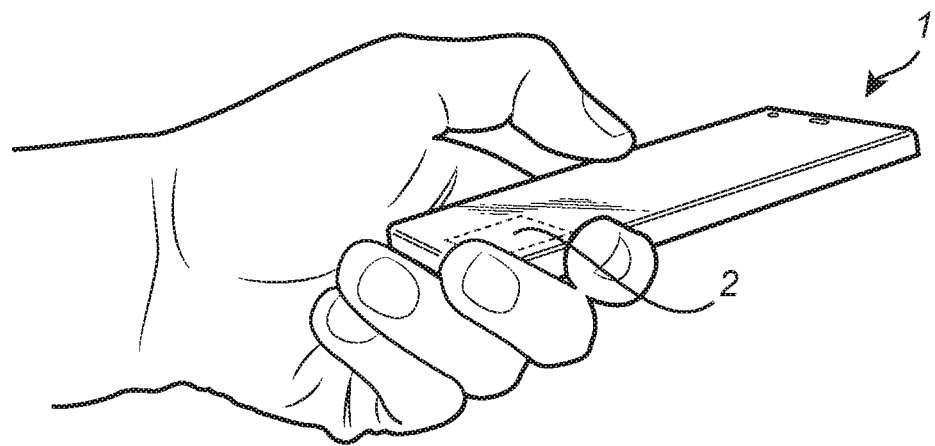
FIG. 1 schematically illustrates a mobile phone comprising a fingerprint sensing device.

FIG. 1 schematically illustrates an application for a fingerprint sensing device 2 according to an example embodiment herein, in the form of a mobile phone 1 with an integrated fingerprint sensing device 2. The fingerprint sensing device 2 may, for example, be used for unlocking the mobile phone 1 and/or for authorizing transactions carried out using the mobile phone, etc. A fingerprint sensing device 2 according to various embodiments of the invention may also be used in other devices, such as tablet computers, laptops, smartcards or other types of consumer electronics device or system.

Figure 2:
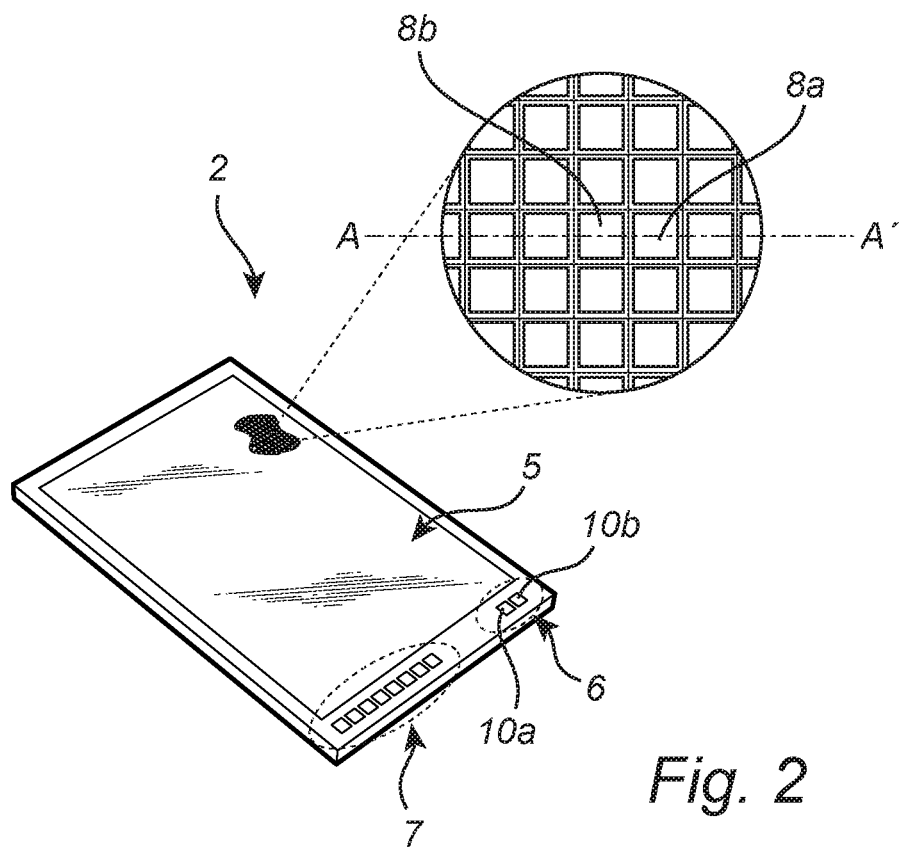
FIG. 2 schematically shows the fingerprint sensing device in FIG. 1.

FIG. 2 schematically shows the fingerprint sensing device 2 comprised in the mobile phone 1 in FIG. 1. As can be seen in FIG. 2, the fingerprint sensing device 2 comprises a sensor array 5, a power supply interface 6 and a communication interface 7. The sensor array 5 comprises a large number of sensing elements 8a-b, where only two of the sensing elements have been indicated with a reference numeral to avoid cluttering the drawing, each sensing element being controllable to sense a distance between a sensing structure comprised in the sensing element 8a-b and the surface of a finger contacting the top surface of the sensor array 5. The sensing elements may advantageously be arranged in an array comprising rows and columns.

The power supply interface 6 comprises a first 10a and a second 10b contact pads, here shown as bond pads, for connection of a supply voltage $V_{supply}$ to the fingerprint sensing device 2.

The communication interface 7 comprises a number of bond pads for allowing control of the fingerprint sensing device 2 and for acquisition of fingerprint data from the fingerprint sensing device 2.

Figure 3:
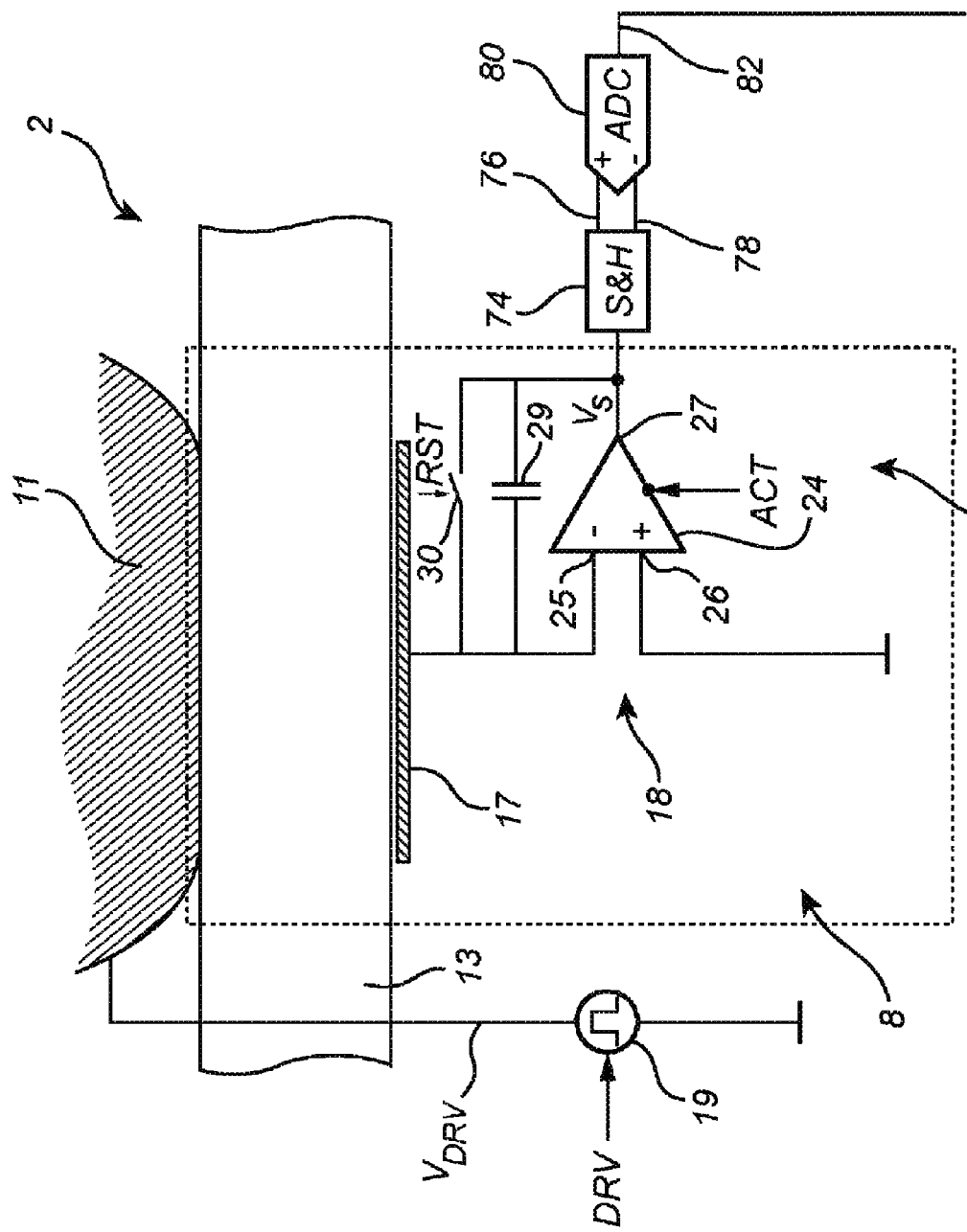
FIG. 3 is a schematic circuit diagram of a part of the fingerprint sensing device, including a sensing circuitry, a sampling circuitry and an analog to digital converter according to an embodiment herein.

FIG. 3 is a schematic cross section and a circuit schematic of a portion of a fingerprint sensing device 2 according to an embodiment herein, taken along the line A-A' as indicated in FIG. 2 with a finger 11 placed on top of the sensor array 5. The fingerprint sensing device comprises a plurality of sensing elements 8, each comprising a protective dielectric top layer 13, a conductive sensing structure 17, underneath the protective dielectric top layer 13. The sensing device 2 further comprises sensing circuitry 18 implemented as a charge amplifier 18. The fingerprint sensing device further comprises a timing circuitry 19 configured to control a timing of a drive signal $V_{DRV}$, the drive signal being configured to provide a change in potential difference between the finger and the sensing structure. As illustrated in FIG. 3, a ridge of the finger 11 is located directly above the sensing structure 17 indicating the minimum distance between the finger 11 and the sensing structure 17, defined by the dielectric top layer 13.

The charge amplifier 18 may comprise at least one amplifier stage, here schematically illustrated as an operational amplifier (op amp) 24 having a first input (negative input) 25 connected to the sensing structure 17, a second input (positive input) 26 connected to ground or to another reference potential, and an output 27. In addition, the charge amplifier 18 may comprise a feedback capacitor 29 connected between the first input 25 and the output 27, and reset circuitry, here functionally illustrated as a switch 30, for allowing controllable discharge of the feedback capacitor 29. The charge amplifier 18 may be reset by operating the reset circuitry 30 to discharge the feedback capacitor 29.

A drive signal circuitry may be configured to provide the drive signal for providing a change in potential difference between said finger 11 and the sensing structure 17 comprised in the sensing elements 8. When a time-varying potential is provided to the finger 11 by the drive signal, a corresponding time-varying potential difference occurs between the sensing structure 17 and the finger 11. The induced change in potential difference between the finger 11 and the reference sensing structure 17 in turn results in a sensing voltage signal $V_s$ on the output 27 of the charge amplifier 18. The change in potential difference between the finger 11 and the sensing structure 17 may also be achieved by connecting the drive signal to the positive input 26 of the charge amplifier 18. Furthermore, the change in potential difference can also be achieved by connecting the drive signal to a common ground plane of the fingerprint sensing device 2.

In the context of the present application, the term "potential" should be understood to mean "electrical potential".

A change in potential difference should, accordingly, be understood to mean a time variable change in an electrical potential, in relation to a reference potential, between the finger and the sensing structure.

Each sensing structure may advantageously be provided in the form of a metal plate, so that the equivalence of a parallel plate capacitor is formed by the sensing structure, i.e. the sensing metal plate, the local finger surface, and the protective dielectric top layer and any air that may locally exist between the local finger surface and the protective layer depending on location in the fingerprint pattern. A change of the charge carried by the sensing structure resulting from the change in potential difference between the finger and the sensing structure is an indication of the capacitance of this parallel plate capacitor, which is in turn an indication of the distance between the sensing structure and the finger surface.

Each sensing element 8 constitutes a pixel, i.e. each sensing element 8 captures one pixel of a fingerprint of a finger placed on the surface of the sensing element 8 and outputs an analog sensing signal. Each sensing element 8 may be selected individually using an X-Y selection matrix, which has the ability to switch the analog sensing signal of each individual sensing element to a central sampling part, for example an analog sampling circuitry 74, as shown in FIG. 3. The analog sampling circuitry 74 is connected to the output 27 of the charge amplifier 18 to receive and sample the analog sensing signal $V_s$. According to some embodiments, the analog sampling circuitry 74 may comprising a plurality of sample and hold circuits arranged to sample the analog sensing signals output from the plurality of sensing elements 8a-b. The sampling circuitry 74 may comprise, or be connected to, a control unit which controls the individual sample and hold (S&H) circuits comprised in the sampling circuitry 74 to sample the analog sensing signal $V_s$ at the desired points in time with reference to the timing of a drive signal.

The sampling circuitry 74 may comprise two outputs, here referred to as a positive output 76 and a negative output 78, which are connected to a differential analog-to-digital converter (ADC) 80. The ADC 80 is configured to convert the sampled analog sensing signal $V_s$, i.e. the difference between the positive output 76 and the negative output 78 into a digital sensing signal 82 indicative of the capacitive coupling, and thereby of the distance, between the sensing structure 17 and the finger 11. Alternatively, the analog sampling circuitry may comprise a single output connected to a single-ended ADC (not shown), in which case the samples are combined in the sampling circuitry prior to the ADC, and where the resulting difference signal is AD-converted. In the present example, the sensing circuitry for a sensing element 17, i.e. for a pixel, is illustrated to comprise one sample-and-hold circuitry module 74 and one ADC 80. However, it is also possible to share the sample-and-hold circuitry 74 and the ADC 80 between many different pixels by using multiplexers to connect a plurality of sensing elements to each one sample-and-hold circuitry module 74. Accordingly, the output 27 of the charge amplifier 18, and/or the output sample-and-hold circuitry 74 may be connected to a multiplexer (not shown). For example, one sample-and-hold circuitry module 74 can be shared by one column of sensing element, i.e. for one column of pixels. The digital sensing signals for all pixels or a group of pixels represent a captured image of a fingerprint, in whole or in part.

As illustrated in FIG. 3, the same sensing circuitry is used to sample a signal both in the noise-detection mode as in the fingerprint mode.

The drive signal circuitry may comprise switching circuitry configured to switch between two or more different potentials, to form a sequence of pulses having a maximum voltage level and a minimum voltage level. Alternatively or in combination, the drive signal circuitry may comprise at least one signal source configured to provide the time-varying excitation potential.

The drive signal circuitry may be included in a fingerprint sensor device, and may then provide the drive signal having the time-varying excitation potential in relation to a reference potential of the fingerprint sensor device, for example a ground potential in the fingerprint sensor device.

Alternatively, the drive signal circuitry may be provided externally to the fingerprint sensor device as a separate chip connected to the fingerprint sensor device to provide the drive signal as a time-varying reference potential for the fingerprint sensor device. In this case, the drive signal may exhibit its time-varying drive potential in relation to a ground potential of the electronic device or system in which the fingerprint sensing device is included. External drive signal circuitry may be controlled using control signals generated by the timing circuitry 19 comprised in the fingerprint sensor device. The drive signal circuitry may also be referred to as excitation signal circuitry. Moreover, the timing circuitry 19 may preferably control the timing of readout and sampling of the sensing signal such that readout is correlated with the drive signal.

Figure 4:
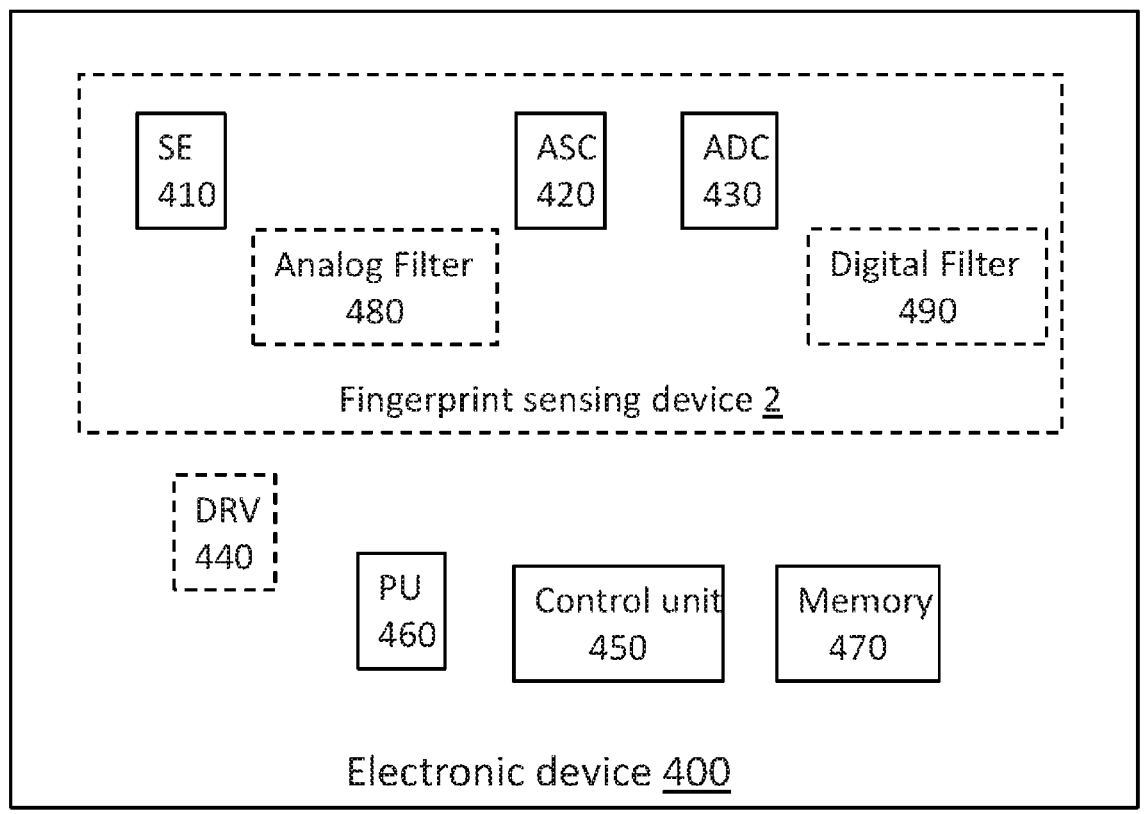
FIG. 4 is block diagram of an electronic device in which the method and the fingerprint sensing device according to embodiments herein may be implemented.

FIG. 4 is a block diagram showing an electronic device 400 in which the fingerprint sensing device 2 according the embodiment herein may be implemented. The electronic device 400 may be mobile phones, tablet computers, laptops, smartcards or any types of consumer electronics device or system. The fingerprint sensing device 2 may comprise sensing elements SE 410, analog sampling circuitry ASC 420, and analog to digital converter ADC 430. The fingerprint sensing device 2 may further comprise drive signal circuitry DRV 440 or DRV 440 may be implemented or located in the electronic device 400 for providing the drive signal. The electronic device 400 may comprise other units or modules, e.g. control unit 450 for controlling SE 410, ASC 420, ADC 430, DRV 440 etc., processing unit PU 460 for data processing or analyzing, Memory 470 for information, image data storage etc. According to some embodiments herein, the fingerprint sensing device 2 may also comprise its own control unit, processing unit and memory which perform similar functionalities as control unit 450, PU 460 and Memory 470 in the electronic device 400. Therefore, hereafter when control unit 450, PU 460 and Memory 470 are mentioned with their functionalities, no distinguishing where they are implemented or located is made, i.e. they may be implemented or located either in the fingerprint sensing device 2 or in the electronic device 400.

According to the embodiments herein, the fingerprint sensing device 2 comprises, as described above, a plurality of sensing elements 8, each sensing element comprises a sensing structure 17 and being configured to sense a capacitive coupling between the sensing structure and a finger placed on a sensing surface of the sensing device. The fingerprint sensing device 2 further comprises sensing circuitry 18 configured to provide a sensing signal indicative of the capacitive coupling between the finger and the sensing structures. The fingerprint sensing device 2 further comprises timing circuitry 19 configured to control a timing of a drive signal, the drive signal being configured to provide a change in potential difference between the finger and the sensing structure.

The fingerprint sensing device is controllable, e.g. by means of the control unit 450, to operate in a noise-detection mode and in a fingerprint mode. So the fingerprint sensing device 2 is configured to, e.g. by means of the control unit 450 being configured to, control the timing circuitry such that no drive signal is provided, when the fingerprint sensing device operates in the noise-detection mode.

The fingerprint sensing device 2 is further configured to sense a capacitive coupling between the finger and at least one sensing structure and provide a sensing signal by means of said sensing circuitry 18.

Since no drive signal is provided to either the sensing device or the finger when the fingerprint sensing device senses a capacitive coupling, only noise is measured or captured. Therefore an existence of noise, e.g. common mode noise or other externally injected noise may be detected in the sensing signal.

When the fingerprint sensing device operates in the fingerprint mode, the sensing device is configured to control the timing circuitry 19 such that a drive signal is provided, and to sense a capacitive coupling between the finger and a plurality of sensing structures and provide sensing signals by means of said sensing circuitry 18 to acquire a fingerprint image.

Sensing signal values for each sampling event may advantageously be determined using the difference between a first sample and a second sample, also referred to as correlated double sampling, which may be used to remove a low frequency component of common-mode noise.

Correlated double sampling is, per se, well known to the skilled person for reducing noise during sampling, and correlated double sampling from sensing elements of a capacitive fingerprint sensor is described in detail in U.S. Pat. No. 7,864,992, hereby incorporated by reference.

Here, the same sampling principle is applied by the same sensing circuitry in both the noise-detection mode and the fingerprint mode, i.e. correlated double sampling. Accordingly, no additional circuitry is required for determining the common mode noise properties. Moreover, fixed sensor settings are used in the noise-detection mode, meaning that all of the samples in a sampling sequence in the noise detection mode are captured using the same sensor settings. The resulting noise signal acquired in the noise detection mode is thus a sequence of correlated double sampling events forming a time dependent signal. Among the plurality of sensing elements, an array of sensing elements, referred as a fingerprint sensing array, may be configured to be used in the fingerprint mode to capture an image of the fingerprint. Moreover, the fingerprint sensing device may also comprise at least one sensing structure located outside of the fingerprint sensing array, where the at least one sensing structure may be used to detect noise. Such a sensing structure may for example be a sensing structure forming a capacitive coupling to a finger placed on the surface of the sensing device, located outside of the fingerprint sensing array, which is also used for other purposes, such as for finger detection functionality. It may also be possible to use at least one dedicated sensing structure located outside of and separate from the fingerprint sensing array for noise detection.

Therefore, according to some embodiments, the at least one sensing structure may be a structure located outside of a fingerprint sensing array used in said fingerprint mode. According to some embodiments, the at least one sensing structure may be a dedicated noise detection structure located outside of and separate from a fingerprint sensing array used in said fingerprint mode. The dedicated noise detection structure may for example be connected to dedicated or generic readout circuitry for detecting a common mode noise signal.

According to some embodiments, the fingerprint sensing device 2 is further configured to, in the noise detection mode, simultaneously sense a capacitive coupling between a finger and a plurality or a group of sensing elements. According to some embodiments, the plurality of sensing elements may be a subset of sensing elements comprised in the fingerprint sensing array, i.e. the array of sensing elements configured to capture a fingerprint image.

According to some embodiments, the simultaneous sensing of a plurality of sensing elements is performed repeatedly to form at least one time-dependent signal representative of noise properties of the sensing device. Several sampling sequences can be performed with different timing settings of the sampling, i.e. different sampling frequencies, between different sequences. By observing the properties of the resulting noise signal, information about the common mode noise can be derived.

According to some embodiments, the fingerprint sensing device 2 is further configured to form an average signal from a plurality of simultaneously captured sensing signals from a plurality of sensing elements.

Above embodiments may be achieved by a built in hardware function support in the fingerprint sensing device 2 such that when the control unit 450 or PU 460 send a command to the fingerprint sensing device 2 to start measure, it will continue to measure the same group of sensing elements until a stop command is received by the fingerprint sensing device 2 from the control unit 450 or PU 460. So the control unit 450 or PU 460 will send a start measure command at a first time instance and a stop measure command at a second time instance, and how many groups or a number of groups that should be measured. In between the first and second time instances, the fingerprint sensing device 2 will continuously measure the addressed groups over and over again. Alternatively, the control unit 450 or PU 460 may send information on how many times to measure the addressed group or groups, or a command on a number of times to measure, and then the fingerprint sensing device 2 will measure the addressed group or groups for the defined number of times. The control unit 450 or PU 460 may also send a command on a number of sensing elements in each group, a command on a start location of the group. For example, a group of eight sensing elements may be selected by the X-Y selection matrix controlled by the control unit 450 and simultaneously sensing capacitive coupling between a finger and a group of sensing elements which comprises a group of 8 signals or samples over and over again. Note that since all the signals or samples in the group or groups are captured at the same time over and over again, the exact same external noise disturbance will be captured or measured. Preferably an average value of these 8 samples can be used to only address the external noise and minimum the internal noise. In this way, the impact from the fingerprint may be decreased and only the noise is captured.

Further this will also avoid producing ridge or valley pattern which may destroy or impact the noise evaluation. Moreover, if the time instances for capturing the part of image are known, a frequency of the noise may be predicted.

According to some embodiments, the fingerprint sensing device 2 may be configured to capture a whole image of a fingerprint once while the drive signal is disabled. The whole image is captured by the array of sensing elements used in the fingerprint mode, i.e. the fingerprint sensing array, by the following procedure as in a normal fingerprint mode. First, the fingerprint sensing device 2 senses capacitive couplings between the finger and the fingerprint sensing array. Then, the sensing circuitry 18 produces an analog sensing signal indicative of the capacitive coupling between the finger and the sensing structures of the fingerprint sensing array. Third, the analog sensing signals are sampled in the analog sampling circuitry 74 and sampled analog sensing signals are produced. Further, the sampled analog sensing signals are converted to digital sensing signals in the analog-to-digital converter 80 connected to the analog sampling circuitry 74. The digital sensing signals thereby represent a captured whole image of a fingerprint. In this way, it is possible to analyze a histogram of the whole image to detect the noise.

According to some embodiments, to avoid saturating sensing elements downwards, e.g. outputting negative sample values, the fingerprint sensing device 2 may be configured to add an offset to each sensing signal. This can be implemented by enabling an offset capacitor located in each sensing element to add an offset to each sensing signal. The offset capacitor is a capacitor located in each sensing element that can be used to input a charge to the sensing element instead through the finger. The offset capacitor may be used in test to verify that the sensing element operation is normal.

From the analog sensing signals, the sampled analog sensing signals, the digital sensing signals or the captured image, the existence of noise, a characteristic of noise, e.g. frequency, amplitude, shape or type of the noise may be determined.

Therefore, according to some embodiments, the fingerprint sensing device 2 is further configured to detect noise by analyzing at least one of the analog sensing signals, the sampled analog sensing signals or the digital sensing signals.

For example, a comparator or limiter may be comprised in the fingerprint sensing device 2 and connected to the output of charge amplifier 18 or the output of the sampling circuitry 74 to detect if there is any signal above a threshold. Noise presences if a signal is detected above the threshold. Alternatively, the digital sensing signals output from the ADC 80 may be analyzed to detect noise by checking or comparing the digital values.

According to some embodiments, the fingerprint sensing device may be configured to determine frequency, amplitude or a type of noise by analyzing at least one of the analog sensing signals, the sampled analog sensing signals, the digital sensing signals or the captured image to. For example, by simply analyzing the analog sensing signals or the sampled analog sensing signals, it can be determined that if the frequency of noise is lower or higher than the fingerprint sensor's sampling frequency; if the type of noise is sine or square wave; amplitude can be evaluated based on the peaks of sensing signals etc. Further, by analyzing a histogram of the captured image, the frequency, amplitude or type of noise may also be determined.

This technique may be used to setup sensor settings of the fingerprint sensing device, e.g. a sampling sequence or sampling frequency using digital filter, analog and digital multisampling techniques etc.

Therefore, according to some embodiments, the fingerprint sensing device may be configured to setup a set of sensor settings in the fingerprint sensing device based on analyzed results.

According to some embodiments, the set of sensor settings in the fingerprint sensing device comprises at least one of or a combination of a sampling sequence or sampling frequency settings of the analog sampling circuitry, a frequency or phase settings of the drive signal provided by the drive signal circuitry.

For example, the analog sampling circuitry 74 may be controlled by predefined hardware settings determining when each sample is captured in relation to the drive signal, or the sampling events may be controlled individually for each separate AD-conversion sequence. For noise having unknown properties, the analog sampling circuitry 74 may be configured to test a number of predefined settings and to determine which of the settings produce the output signal having the lowest noise level, and the preferred setting can then be used in subsequent AD-conversion sequences.

The analog sampling circuitry 74 may advantageously be configured to sample the sensing signal at selected points in time based on a known property of a noise component such that the noise component is suppressed. The general principle of the sampling is to select the samples such that the resulting combination of samples results in an effective suppression or cancellation of the noise contribution to the sensing signal. Accordingly, it is possible to configure the timing circuitry and sampling circuitry to suppress specific types of noise having at least partially known properties.

In particular, externally injected common mode noise, which may originate from a charging device connected to the electronic device in which the fingerprint sensing device is arranged, typically exhibits a fixed pattern over time with respect to frequency, pulse shape and amplitude. Thereby, by knowing the properties of the common mode noise, the timing of the drive signal, e.g. the frequency and duty cycle of a drive signal during fingerprint sensing can be selected to suppress or cancel the noise component.

According to some embodiments, several different noise signals are captured in the noise detection mode, using different sampling intervals, i.e. different sampling frequencies, for capturing the different noise signals. Thereby, information describing the common mode noise can be derived from the captured noise signals. In particular, the properties (amplitude and frequency) of the noise signal describe the noise which would be captured during image capture using the same sampling frequency. Accordingly, a sampling frequency for a noise signal having less noise is more suitable for image capture compared to a sampling frequency resulting in more noise. Thereby, a preferred sampling frequency for image capture can be acquired by means of the described method since sampling during image capture is performed in the same manner as in the noise detection mode. Moreover, a frequency of a noise component can be determined based on the sampling frequency providing the noise signal having the highest noise amplitude.

For example, the timing circuitry 19 may be configured to control a drive signal to be in the form of a pulse train having a frequency being a multiple or division of a frequency of a known noise component. By adjusting the drive signal to provide a pulse train, such as a square wave, having a frequency being a multiple of a known frequency of a noise component, the noise can be more effectively suppressed. The timing circuitry 19 may also be configured to control a drive signal to be in the form of a pulse train being out of phase of a noise component having a known frequency. If the drive signal comprises a pulse train such as a square wave or a sine wave having a frequency similar to the frequency of the noise, it may be form a filter which effectively suppresses the noise. This may for example be achieved by gradually changing, or shifting, the phase of the pulse train for consecutive AD-conversions to determine for which phase noise suppression is most effective.

According to some embodiments, the fingerprint sensing device 2 may comprise an active or a passive analog filter, e.g. Analog Filter 480 as shown in FIG. 4, wherein the active or passive analog filters may be configured based on analyzed results. For example, the active or passive analog filters may comprise switched capacitors or resistors such that the frequency of the active or passive analog filters may be configurable based on the frequency of the noise.

According to some embodiments, the fingerprint sensing device 2 may comprise a digital filter, e.g. Digital Filter 490 as shown in FIG. 4, the digital filter 490 may be configured based on analyzed results.

Further, the active or passive analog filters 480 and/or the digital filters 490 may be configured in combination with the sampling sequence or sampling frequency settings of the analog sampling circuitry, the frequency or phase settings of the drive signal provided by the drive signal circuitry. In another word, all possible sets of sensor settings in the fingerprint sensing device may comprise at least one of or a combination of the active or passive analog filters settings, digital filters settings, the analog sampling circuitry settings, and the drive signal circuitry settings.

Figure 5:
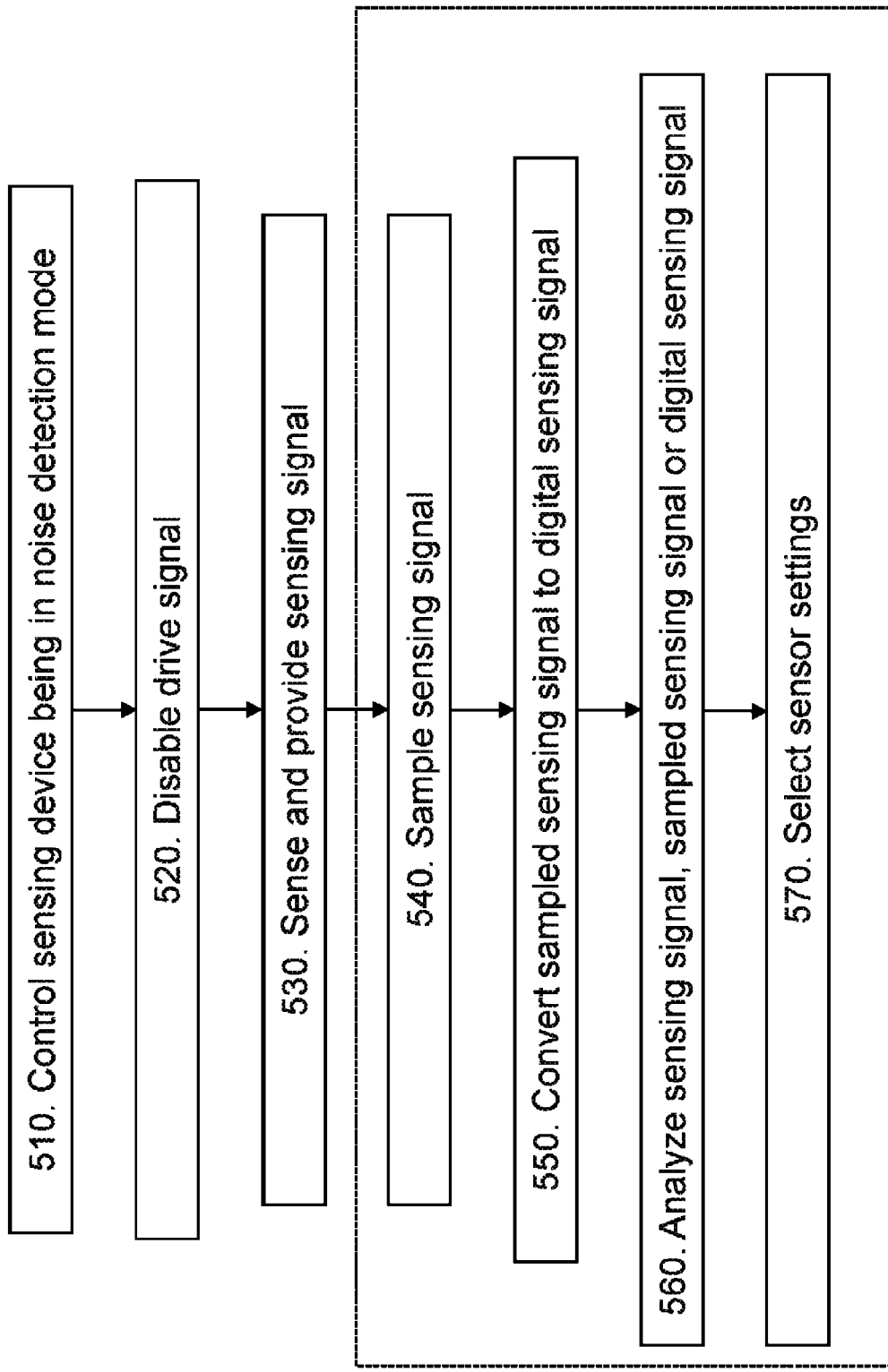
FIG. 5 is a flow chart outlining a method for the fingerprint sensing device according to an embodiment herein.

Corresponding method for detect noise in a fingerprint sensing device 2 will be described with reference to FIG. 5. According the embodiments herein, the method comprises the following actions:

Action 510

The sensing device 2 is controlled to operate in the noise-detection mode.

Action 520

The drive signal is disabled by the timing circuitry.

Action 530

The sensing device 2 senses a capacitive coupling between the finger and at least one sensing structure and provides a sensing signal indicative of the capacitive coupling between the finger and the sensing structures by means of the sensing circuitry 18. Then the noise may be detected by analyzing the sensing signal, which will be described in the following by Action 560.

According to some embodiments, the sensing device 2 simultaneously senses a capacitive coupling between a finger and a plurality of sensing structure.

According to some embodiments, the sensing device 2 repeatedly senses the capacitive coupling between the finger and the at least one sensing structure to form a time-dependent signal representative of noise properties of the sensing device. For example, the finger sensing device 2 measures continuously until a stop command is received, to measure a given number of samples or to measure for a given period of time.

According to some embodiments, the sensing device 2 repeatedly senses the capacitive coupling between the finger and a plurality of sensing structures to form a plurality of time-dependent signals representative of noise properties of the sensing device.

According to some embodiments, the sensing device 2 forms an average value of a plurality of simultaneously captured sensing signals to form an averaged time-continuous signal representative of noise properties of the sensing device.

According some embodiments, a whole image may be captured once while the drive signal is disabled. The whole image is captured by the array of sensing elements used in the fingerprint mode. In this way, it is possible to analyze a histogram of the whole image to detect the noise.

According some embodiments, an offset may be added to each sensing signal, for example by enabling an offset capacitor located in each sensing element.

As mentioned above, the noise detect technique according to the embodiments herein may be used to setup sensor settings of the fingerprint sensing device 2. According to some embodiments, each set of sensor settings in the fingerprint sensing device may comprise at least one of or a combination of a sampling sequence or sampling frequency settings of the analog sampling circuitry 74, a frequency or phase settings of the drive signal provided by the drive signal circuitry, one or more active or passive configurable analog filters settings, and one or more configurable digital filters settings.

For evaluating sensor settings and select a set of sensor setting based on the evaluated results, Action 530 may be performed for a plurality set of sensor settings. The sensing signals produced from Action 530 may be further processed by the following actions:

Action 540

The sensing device 2 samples the sensing signals in the analog sampling circuitry 74 comprising one or a plurality of sample and hold circuits.

Action 550

The sensing device 2 converts the sampled sensing signal to digital sensing signals representing a captured image of a fingerprint in the analog-to-digital converter 80 connected to the analog sampling circuitry 74.

Actions 530-550 may be performed for all possible sets of sensor settings to evaluate their performance or just to evaluate some sensor settings based on a preliminary knowledge of the noise, e.g. high frequency or low frequency noise, and the method further comprises the following actions:

Action 560

Signals from at least one of the sensing circuitry, the analog sampling circuitry or the analog-to-digital converter are analyzed for the plurality sets of sensor settings.

For example, the amplitude of the signals from the sensing circuitry, the analog sampling circuitry or the analog-to-digital converter may be analyzed to determine if noise is present. If the amplitude of the signals from the sensing circuitry, the analog sampling circuitry or the analog-to-digital converter for a set of sensor settings is larger than a pre-defined threshold, noise is detected.

Action 570

A set of sensor settings is selected by comparing the analyzed results for the plurality sets of sensor settings in the fingerprint sensing device 2.

For example, the amplitude of the signals from the sensing circuitry, the analog sampling circuitry or the analog-to-digital converter may be compared for all possible sets of sensor settings in the fingerprint sensing device 2, the set of sensor settings which produce the signals having the lowest amplitude, i.e. lowest noise level, may be selected.

Therefore the technique according to embodiments herein may be used to setup the sensor setting by just knowing the presence of noise without knowing exactly the properties of noise. For example, it is possible to employ a number of preset analog sampling sequences and to evaluate the resulting signals from the sensing circuitry, the analog sampling circuitry or the analog-to-digital converter to determine which of the sampling sequences produce the output signal having the lowest noise content. The same procedure may be applied to the drive signal circuitry to tune the drive signal in many different ways and evaluate the resulting signals from the sensing circuitry, the analog sampling circuitry or the analog-to-digital converter to determine which of the drive signal produce the output signal having the lowest noise content. Thereby, sensor settings may be setup even if the noise properties are unknown.

It is also possible to determine the noise properties, e.g. frequency, amplitude or type, by analyzing the analog sensing signals from the sensing circuitry, the sampled sensing signal from the analog sampling circuitry, the digital sensing signal from the analog-to-digital converter or the captured image. In this case, at least one of or a combination of the active or passive analog filters settings, digital filters settings, the analog sampling circuitry settings, and the drive signal circuitry settings in the fingerprint sensing device may be setup to suppress the determined noise.

To summarize, the fingerprint sensing device 2 and the method therein for detecting noise, evaluating and selecting sensor settings according to the embodiments herein have some advantages. Since the drive signal is disabled when the fingerprint sensing device 2 senses capacitive coupling to capture an image of a fingerprint, only noise is captured. In this way, the performance of all possible sensor settings in the fingerprint sensing device 2 may be evaluated during sampling, i.e. the analog sensing signals, the sampled analog sensing signals or the digital sensing signals may be analyzed to determine the presence of noise or the characterization of noise. A set of sensor settings may be selected by comparing the evaluated or analyzed results, so the set of sensor settings with lowest noise may be selected. In this way, a robust hardware based technique that effectively can setup the sensor settings to reduce or suppress noise already during the image sampling is achieved. Therefore, robust operation during navigation or other hardware based applications may be achieved. Furthermore, since the fingerprint sensing device has already setup the sensor setting with reduced noise at start up, the dynamic range of the fingerprint sensing device can be improved and saturation can be avoided. So during normal image capturing procedure, image corruption may be avoided, and post-processing may be performed effectively and image quality may be improved even more for captured fingerprint image. Moreover, this technique may be used at any time when necessary to determine or detect common mode noise or other external injected noise.

Even though the present invention has been described with reference to specific exemplifying embodiments thereof, many different alterations, modifications and the like will become apparent for those skilled in the art. Also, it should be noted that parts of the fingerprint sensing device 2 may be omitted, interchanged or arranged in various ways. For example, as mentioned before, control unit 450, PU 460 and Memory 470 may be implemented either in the fingerprint sensing device 2 or in the electronic device 400 for performing the functions and actions of the embodiments herein. The embodiments herein may also be implemented through one or more processors, such as PU 460 together with computer program code for performing the functions and actions of the embodiments herein. The program code mentioned above may also be provided as a computer program product, for instance in the form of a data carrier carrying computer program code for performing the embodiments herein when being loaded into the electronic device 400 or the fingerprint sensing device 2. One such carrier may be in the form of a CD ROM disc. It is however feasible with other data carriers such as a memory stick. The computer program code may furthermore be provided as pure program code on a server and downloaded to the electronic device 400 or the fingerprint sensing device 2.

Additionally, variations to the disclosed embodiments can be understood and effected by the skilled person in practicing the claimed subject-matter, from a study of the drawings, the disclosure, and the appended claims. In the claims, the word "comprise" or "comprising" does not exclude other elements or steps, it shall be interpreted as non-limiting, i.e. meaning "consist at least of", and the indefinite article "a" or "an" does not exclude a plurality.

The invention claimed is:

1. A capacitive fingerprint sensing device for sensing a fingerprint pattern of a finger, said capacitive fingerprint sensing device comprising:
   a plurality of sensing elements, each sensing element comprising a sensing structure and being configured to sense a capacitive coupling between the sensing structure and a finger placed on a sensing surface of the sensing device;
   sensing circuitry configured to provide a sensing signal indicative of the capacitive coupling between the finger and the sensing structures;
   timing circuitry configured to control a timing of a drive signal, the drive signal being configured to provide a change in potential difference between the finger and the sensing structure;
   wherein the fingerprint sensing device is controllable to operate in a noise-detection mode and in a fingerprint mode such that:
      when the fingerprint sensing device operates in the noise-detection mode, the fingerprint sensing device is configured to control the timing circuitry such that no drive signal is provided, and to repeatedly sense a capacitive coupling between the finger and at least one sensing structure for a predetermined time period by means of said sensing circuitry, and to provide a noise signal characterizing common mode noise in said fingerprint sensing device; and
      when the fingerprint sensing device operates in the fingerprint mode, the sensing device is configured to control the timing circuitry such that a drive signal is provided, and to sense a capacitive coupling between the finger and a plurality of sensing structures and to provide sensing signals by means of said sensing circuitry to acquire a fingerprint image.

2. The fingerprint sensing device according to claim 1, being further configured to, in the noise detection mode, simultaneously sense a capacitive coupling between a finger and a plurality of sensing structures.

3. The fingerprint sensing device according to claim 2, wherein the plurality of sensing structures are comprised in a subset of sensing elements comprised in an array of sensing elements configured to capture a fingerprint image.

4. The fingerprint sensing device according to claim 2, wherein the simultaneous sensing of a plurality of sensing structures is performed repeatedly to form at least one time-dependent signal representative of noise properties of the sensing device.

5. The fingerprint sensing device according to claim 2, the sensing device being further configured to form an average signal from a plurality of simultaneously captured sensing signals from a plurality of sensing elements.

6. The fingerprint sensing device according to claim 1, wherein when the sensing device operates in the noise-detection mode, the sensing device is configured to acquire a whole image for at least one time, wherein the whole image is captured by an array of sensing elements used in the fingerprint mode.

7. The fingerprint sensing device according to claim 1, wherein the fingerprint sensing device further comprising an offset capacitor configured to add an offset to the sensing signal.

8. The fingerprint sensing device according to claim 1, further comprising:
analog sampling circuitry comprising one or a plurality of sample and hold circuits arranged to sample the sensing signals;
an analog-to-digital converter connected to said analog sampling circuitry and configured to convert the sampled sensing signals to digital sensing signals representing a captured image of a fingerprint; and
wherein said fingerprint sensing device is further configured to detect noise by analyzing at least one of the sensing signals, the sampled sensing signals or the digital sensing signals.

9. The fingerprint sensing device according to claim 1, wherein said fingerprint sensing device is further configured to determine frequency, amplitude or type of noise by analyzing at least one of the sensing signals, the sampled sensing signals, the digital sensing signals or the captured image.

10. The fingerprint sensing device according to claim 8, wherein said fingerprint sensing device is further configured to setup a set of sensor settings in the fingerprint sensing device based on analyzed results.

11. The fingerprint sensing device according to claim 10, wherein the set of sensor settings in the fingerprint sensing device comprises at least one of or a combination of a sampling sequence or sampling frequency settings of the analog sampling circuitry, a frequency or phase settings of the drive signal provided by a drive signal circuitry.

12. The fingerprint sensing device according to claim 8, wherein the fingerprint sensing device further comprises an active or a passive analog filter, wherein the active or passive analog filters is configured based on analyzed results.

13. The fingerprint sensing device according to claim 8, wherein the fingerprint sensing device further comprises a digital filter, and the digital filter is configured based on analyzed results.

14. A method for noise detection in a fingerprint sensing device, wherein the fingerprint sensing device comprises:
a plurality of sensing elements, each sensing element comprising a sensing structure and being configured to sense a capacitive coupling between the sensing structure and a finger placed on a sensing surface of the sensing device;
sensing circuitry configured to provide a sensing signal indicative of the capacitive coupling between the finger and the sensing structures; and
timing circuitry configured to control a timing of a drive signal, the drive signal being configured to provide a change in potential difference between the finger and the sensing structure;
the sensing device being controllable to operate in a noise-detection mode and in a fingerprint mode; and the method comprising:
controlling the sensing device to operate in the noise-detection mode;
controlling the timing circuitry such that no drive signal is provided;
repeatedly sensing a capacitive coupling between the finger and at least one sensing structure and providing a time-dependent noise signal indicative of the capacitive coupling between the finger and the sensing structures by means of said sensing circuitry, said noise signal being representative of common mode noise properties of the sensing device.

15. The method according to claim 14, further comprising, simultaneously sensing a capacitive coupling between a finger and a plurality of sensing structures.

16. The method according to claim 14, further comprising repeatedly sensing the capacitive coupling between the finger and a plurality of sensing structures to form a plurality of time-dependent signals representative of noise properties of the sensing device.

17. The method according to claim 16, further comprising forming an average value of a plurality of simultaneously captured sensing signals to form an averaged time-continuous signal representative of noise properties of the sensing device.

18. The method according to claim 14, further comprising controlling the finger sensing device to measure continuously until a stop command is received, to measure a given number of samples or to measure for a given period of time.

19. The method according to claim 14, further comprising acquiring a whole image for at least one time, wherein the whole image is captured by an array of sensing elements used in the fingerprint mode.

20. The method according to claim 14, wherein the method further comprises:
sensing a capacitive coupling between the finger and at least one sensing structure and providing a sensing signal indicative of the capacitive coupling between the finger and the sensing structures by means of said sensing circuitry (18) for a plurality sets of sensor settings in the fingerprint sensing device;
sampling the sensing signal in an analog sampling circuitry (74) comprising one or a plurality of sample and hold circuits;
converting the sampled sensing signal to digital sensing signals representing a captured image of a fingerprint in an analog-to-digital converter connected to said analog sampling circuitry;
analyzing signals from at least one of the sensing circuitry, the analog sampling circuitry or the analog-to-digital converter for the plurality sets of sensor settings; and
selecting a set of sensor settings by comparing the analyzed results for the plurality sets of sensor settings.

21. The method according to claim 20, wherein the plurality of sets of sensor settings in the fingerprint sensing device comprises at least one of or a combination of a sampling sequence or sampling frequency setting of the analog sampling circuitry, a frequency or phase setting of the drive signal provided by a drive signal circuitry, one or more active or passive configurable analog filters settings, one or more configurable digital filters settings.

* * * * *